United States Patent
Nguyen et al.

(10) Patent No.: US 6,566,855 B1
(45) Date of Patent: May 20, 2003

(54) CURRENT SENSOR WITH FREQUENCY OUTPUT

(75) Inventors: Huy D. Nguyen, Livermore, CA (US);
Keith O. Brink, San Jose, CA (US);
Daniel B. Schuster, San Francisco, CA (US); Nicholas J. Holman, San Jose, CA (US)

(73) Assignee: Neilsen-Kuljian, Inc., Campbell, CA (US)

( * ) Notice: Subject to any disclaimer, the term of this patent is extended or adjusted under 35 U.S.C. 154(b) by 39 days.

(21) Appl. No.: 09/839,639

(22) Filed: Apr. 20, 2001

(51) Int. Cl.[7] ............................................... G01R 33/00
(52) U.S. Cl. ................................ 324/117 R; 324/117 H
(58) Field of Search ........................ 324/117 R, 117 H, 324/126, 127, 141, 142, 72.5

(56) References Cited

U.S. PATENT DOCUMENTS

| | | | | |
|---|---|---|---|---|
| 5,341,088 A | * | 8/1994 | Davis | 324/106 |
| 5,552,702 A | * | 9/1996 | Wissman | 324/127 |
| 6,043,641 A | * | 3/2000 | Singer et al. | 324/127 |

* cited by examiner

Primary Examiner—Kamand Cuneo
Assistant Examiner—Minh N. Tang
(74) Attorney, Agent, or Firm—Thelen Reid & Priest; Thierry Lo

(57) ABSTRACT

A device measures current magnitude in a conductor coupled to an electrical device and generates a signal comprising a series of pulses having a frequency. The frequency of the series of pulses is responsive to the magnitude of current measured. The device comprises a sensor magnetically linked with the conductor connected to the electrical device. The sensor produces an analog signal in response to the presence of a current within the conductor. A signal conditioner is located proximate to the sensor and is electrically coupled to the sensor so as to receive the analog signal. The signal conditioner produces, in response to the analog signal, a first signal representative of a magnitude of the current. A converter receives and converts the first signal into an output signal that comprises a series of pulses having a frequency. The frequency of the series of pulses is responsive to the magnitude of the current. All the sensor, the signal conditioner, and the converter are located in a single unitary package.

16 Claims, 4 Drawing Sheets

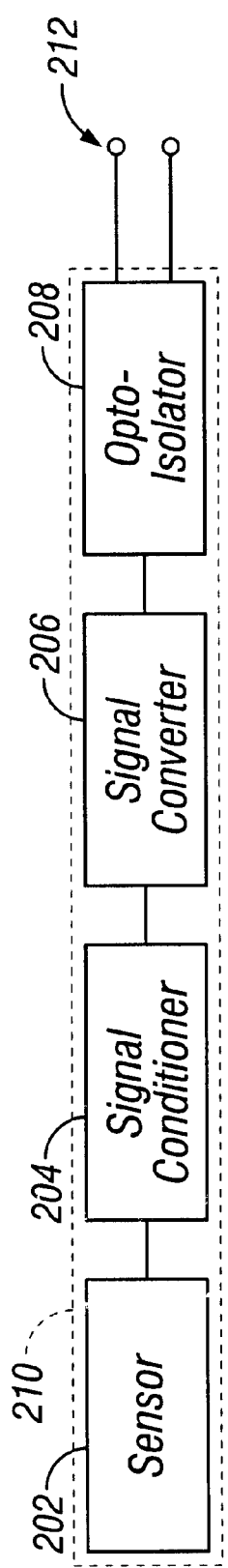
FIG. 2
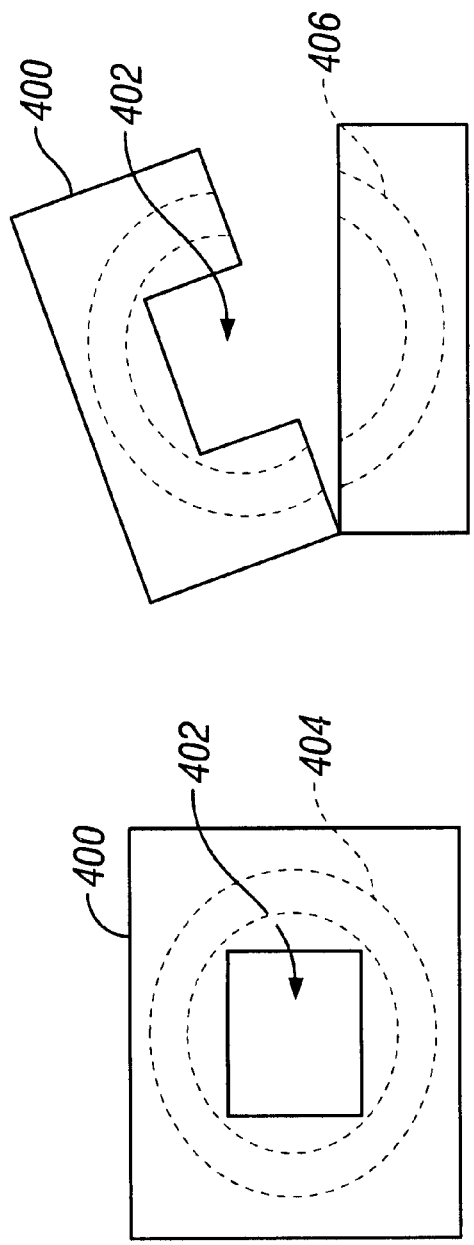
FIG. 4A
FIG. 4B

CURRENT SENSOR WITH FREQUENCY OUTPUT

FIELD OF THE INVENTION

The present invention relates to a current measuring device. More particularly, the present invention relates to a device that measures electric current in a conductor and produces a frequency output signal responsive thereto.

BACKGROUND OF THE INVENTION

Controlling pumps, compressors, heaters, conveyors, and other electrically powered loads requires accurate, real-time status feedback. Current sensing is a reliable and economical way to monitor and control electrically powered loads. Current transducers are commonly used to accurately measure the electric current in a conductor. Single piece non-contact current transducers measure AC or DC current in the conductor and output a proportional analog signal in response to the presence of current in the conductor. The types of analog signals generally include DC voltage (0–5V or 0–10V), AC voltage (0–0.33V up to 0–10V) or a DC current (0–1 mA, 0–20 mA or 4–20 mA).

Current sensors are frequently used to provide essential information to automated control systems, and as primary controllers in relay logic schemes. Because current transducers can be connected directly to data systems and display devices, they are ideal for monitoring motors, pumps, conveyors, machine tools, and any electrical load that requires an analog representation over a wide range of currents.

However for an automation system to read this type of analog output, it must be equipped with an analog input (AI) card. An AI card usually includes terminals, signal conditioning and analog to digital conversion (ADC). The analog signal is converted into a digital word that quantifies the analog level. The AI cards are expensive. Adding a single analog input can add several hundreds of dollars in cost. This makes analog inputs cost prohibitive in many installations.

The other generally available automation system input is a digital input (DI). DI reads simple contact closures. Many systems are only equipped with DI and cannot be fitted with an analog input card at all. For these systems, reading true analog inputs is impossible. However, many of the digital inputs in these systems incorporate high speed counters. These counters take a rapidly switched signal having a particular frequency and convert it into a digital word. This digital word can perform the same function as the word produced by an AI card. For these types of systems, an analog signal generated by a current sensor must be converted to a frequency (series of contact closures) in a separate signal conditioning component.

Accordingly, a need exists for a measuring device that integrates a sensor, a signal conditioner and a frequency output into a single device. The measuring device should be compact, inexpensive, and easy to install.

BRIEF DESCRIPTION OF THE INVENTION

A device measures current magnitude in a conductor coupled to an electrical device and generates a signal comprising a series of pulses having a frequency. The frequency of the series of pulses is responsive to the magnitude of current measured. The device comprises a sensor magnetically linked with the conductor connected to the electrical device. The sensor produces an analog signal in response to the presence of a current within the conductor. A signal conditioner is located proximate to the sensor and is electrically coupled to the sensor so as to receive the analog signal. The signal conditioner produces, in response to the analog signal, a first signal representative of a magnitude of the current. A converter receives and converts the first signal into an output signal that comprises a series of pulses having a frequency. The frequency of the series of pulses is responsive to the magnitude of the current. All the sensor, the signal conditioner, and the converter are located in a single unitary package.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 2 is a schematic diagram of components of a device in accordance with a specific embodiment of the present invention.

FIG. 4A is a schematic representation of a device in accordance with a specific embodiment of the present invention.

FIG. 4B is a schematic representation of a device in accordance with an alternative embodiment of the present invention.

DETAILED DESCRIPTION

Embodiments of the present invention are described herein in the context of a current sensor with frequency output. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
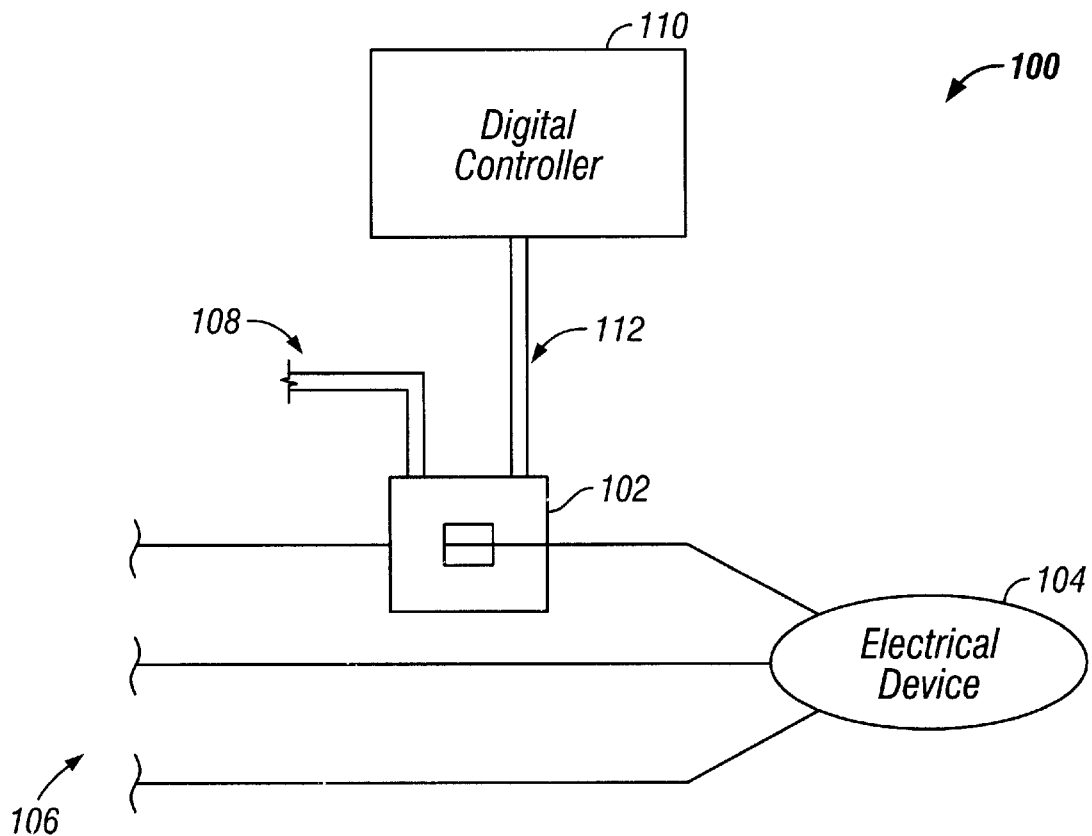
FIG. 1 is a schematic representation of an electrical system that includes a device in accordance with a specific embodiment of the present invention, a controller, and an electrical device.

Referring to FIG. 1, an electrical system 100 includes a device 102 that measures current used by an electrical device 104. For example, the electrical device 104 may be a pump, a grinder, a fan, a conveyor, a motor, etc. Three power cables 106 generally provide electrical power to the electrical device 104. A separate power line 108 provides electrical power to the device 102. Device 102 is magnetically coupled to one power cables 106 for measuring current used by the electrical device 104. The device 102 then outputs and transmits a frequency signal to a digital controller 110 via electrical cables 112. The digital controller 110 may be, for example, a micro Programmable Logic Controller (PLC) with digital input, or any automation system input with digital input.

Referring to FIG. 2, the device 102 includes a current sensor 202, a signal conditioner 204, a frequency converter 206, and an opto-isolator 208 within a single package 210. An output 212 is electrically connected to the opto-isolator 208.

The current sensor 202 is magnetically coupled to one of the power cables 106. Preferably, the current sensor 202 has a central opening through which one of the power cables 106 is routed. Any type of sensor may be used for measuring an alternating current (AC) or direct current (DC) in the power cables 106.

For example, the current sensor 202 may be an inductive type sensor that includes a wire-wound core. One of the power cables 106 passes through a magnetically permeable core that magnifies the cables' magnetic field. AC current constantly changes potential from positive to negative and back again, generally at the rate of 50 Hz or 60 Hz. The expanding and collapsing magnetic field induces current in the windings allowing one to accurately measure the electrical current in power cables 106. Inductive sensors are designed to measure AC power and typically operate between 20 Hz and 100 Hz, although some units will work in the kilohertz range.

Another type of sensor 202 may also use a Hall effect. This type of sensor is a non-contact technology based on the principle that for a given current flow, a proportional magnetic field is produced around the current-carrying conductor. A Hall effect sensor measures the magnetic field using two basic components: a core and a Hall effect device. One of power cables 106 may pass through a magnetically permeable core that concentrates the cable's magnetic field. The Hall effect device is carefully mounted in a small slit in the magnetic core, at a right angle to the concentrated magnetic field. A constant current in one plane excites it. When the energized Hall device is exposed to a magnetic field from the core, it produces a potential difference (voltage) that can be measured and amplified into process level signals.

Yet another type of sensor 202 may be a Rogowski type sensor. A Rogowski current transducer is used for measuring an electric current. It provides an output voltage which is proportional to current (e.g. 1 mV/A). It tracks the current as it changes with time and therefore can reproduce the current waveform on an oscilloscope or any type of data recorder. Alternatively the output can be connected to a digital voltmeter (DVM) to give a reading of rms current. Each Rogowski current transducer comprises a Rogowski coil connected to an electronic integrator by a co-axial cable. The coil is closely wound on a thin plastic tube of circular cross section and surrounded by insulation. It may be looped around one of the power cables 106 carrying the current to be measured. One end of the coil is permanently attached to the connecting cable. The other end is free and is normally inserted into a socket adjacent to the cable connection. However the free end can be unplugged to enable the coil to be looped around one of the power cables 106. The coil is flexible and therefore can be inserted between closely mounted power cables where access is restricted. The loop does not need to be circular and the current does not need to be centrally situated or evenly distributed within the loop.

A resistive shunt may be used in the sensor 202. The resistive shunt is a calibrated resistor placed in a current path that produces a voltage drop proportional to the current flow according to:

$$V=IR$$

where V is voltage, I is current, and R is resistance. The voltage drop measurement is typically in the millivolt AC range.

It is noted that any other sensors for measuring current or power, for example giant magneto restrictive or magneto resistive, may be implemented in device 210 as sensor 202.

Figure 3A:
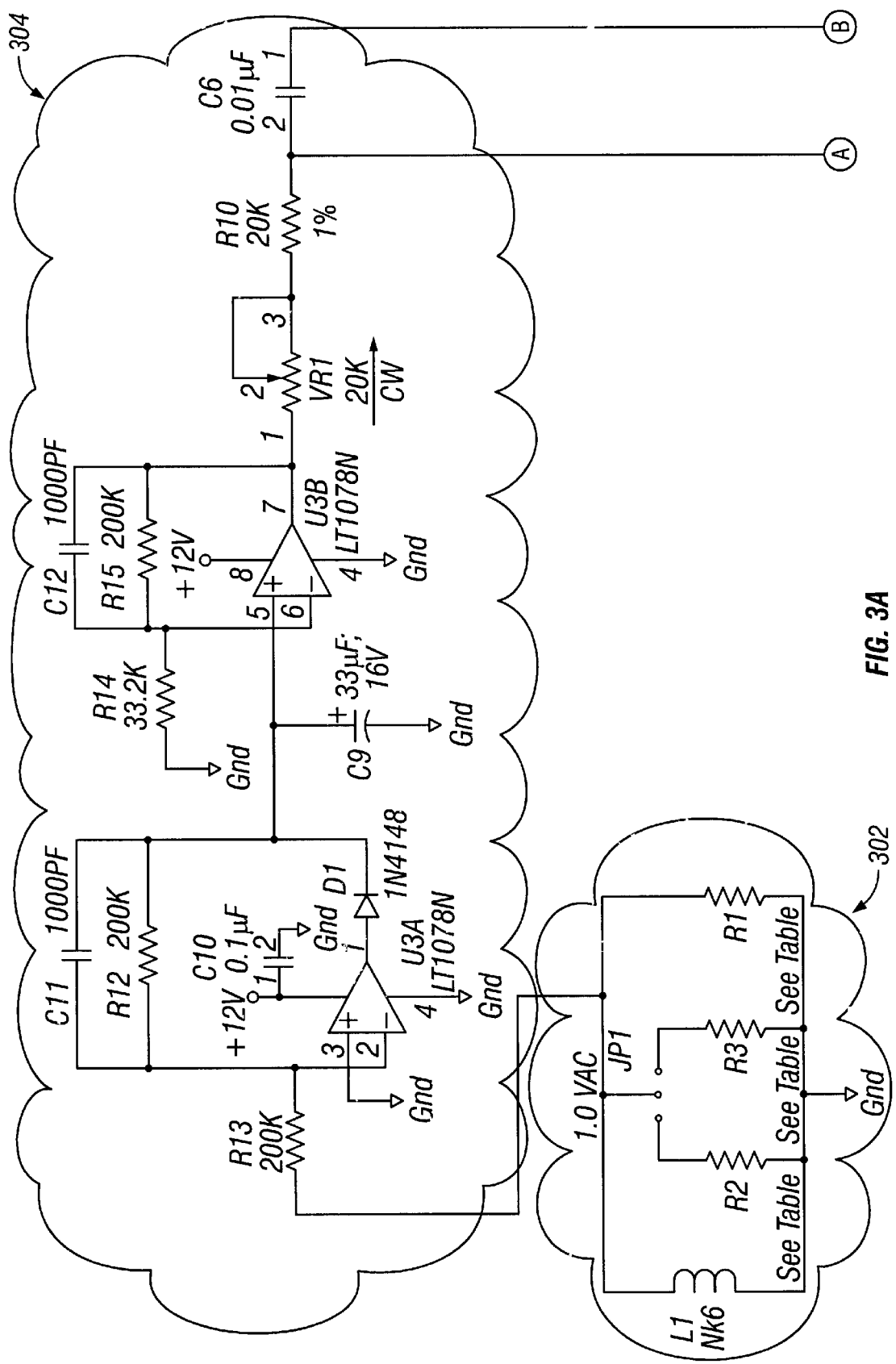
FIG. 3 is an electrical schematic diagram of a signal conditioner, a converter and an opto-isolator which are a portion of a specific embodiment of the present invention.
Figure 3B:
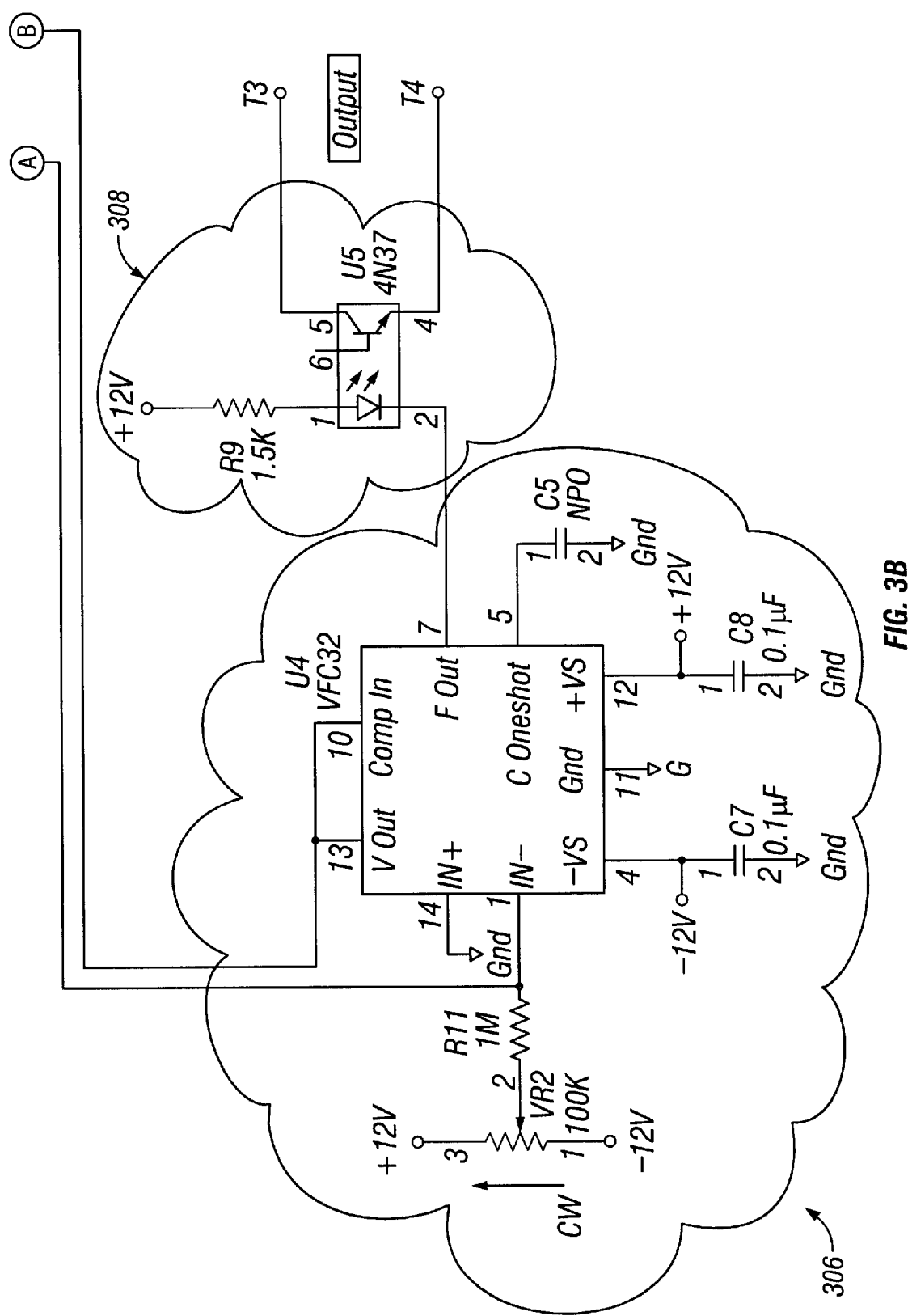

The sensor 202 preferably includes an electrical circuit 302 such as the one illustrated in FIG. 3. The sensor 202 produces an analog signal in response to the presence of the current in one of the power cables 106. The analog signal is sent to the proximate signal conditioner 204. The signal conditioner 204 preferably includes an electrical circuit 304 such as the one illustrated in FIG. 3. The analog signal received by the signal conditioner 204 is conditioned into a process signal compatible with the input specification of the frequency converter 206. The analog signal is usually very small for the frequency converter 206 to detect. The signal conditioner 204 amplifies the analog signal and produces a variable process signal corresponding to the analog signal and matching the input specification of the frequency converter 206.

The analog process signal generated by signal conditioner 204 is converted into frequency signal through the frequency converter 206. FIG. 3 illustrates an example of an electrical circuit 306 for the frequency converter 206. The frequency converter 206 is a generally commercially available chip that converts the analog process signal generated by signal conditioner 204 into a frequency output, for example in the 1 kHz–20 kHz range. The signal converter 206 is designed to interface with frequency conditioner 206 to receive the analog process signal. The frequency converter 206 preferably outputs a square wave signal having a frequency allowing the digital controller 110 to count the frequency.

The opto-isolator 208 is disposed between the output 212 and the frequency converter 206 to isolate the electrical circuitry of FIG. 3 from the output 212. FIG. 3 illustrates an example of an electrical circuit 308 of the opto-isolator 208. Generally, the electrical circuit 308 includes a light emitting diode (LED) 310 optically connected to a photo-transistor 312. The LED 310 is illuminated when the output of the frequency converter 206 produces a square wave signal. The photo-transistor 312 responds to the LED 310 and generates collector and emitter outputs 212.

The current sensor 202, the signal conditioner 204, the frequency converter 206, and the opto-isolator 208 are located within a housing 400 as illustrated in FIGS. 4A and 4B. The housing 400 has a central opening 402 through which one of the power cables 106 is disposed. A magnetic core preferably surrounds the central opening 402. The magnetic core may be a solid core 404 as illustrated in FIG. 4A or a split core 406 as illustrated in FIG. 4B. The split core 406 includes built-in mounting brackets (not shown) that render installation simple.

An alternative embodiment of the measuring device may be mounting the components in proximity to one another on a circuit board. A resistive shunt may be preferred when the components are mounted on a circuit board.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A device for measuring current magnitude in a conductor to an electrical device and for generating a signal comprising a series of pulses having a frequency, the frequency of the series of pulses responsive to the magnitude of current measured, the device comprising:

a sensor magnetically linked with a power cable connected to the electrical device, said sensor producing an analog signal in response to the presence of a current within the power cable;

a signal conditioner located proximate to said sensor and being electrically coupled to said sensor so as to receive said analog signal, said signal conditioner producing, in response to receiving said analog signal, a first signal representative of a magnitude of said current; and a converter for receiving and converting said first signal into an output signal comprising a series of pulses having a frequency, the frequency of the series of pulses being responsive to said magnitude of said current, wherein all of said sensor, said signal conditioner, and said converter are located in a single unitary package.

2. The device according to claim 1, wherein said sensor includes an inductive transducer having a wire-wound core encircling said power cable.

3. The device according to claim 1, wherein said sensor includes a Hall effect transducer having a split core encircling said power cable.

4. The device according to claim 1, wherein said sensor includes a Rogowski current transducer disposed around said power cable.

5. The device according to claim 1, wherein said current within the power cable is a direct current.

6. The device according to claim 1, wherein said current within the power cable is an alternating current.

7. The device according to claim 1, wherein said analog signal is a direct current signal.

8. The device according to claim 1, wherein said analog signal is an alternating current signal.

9. The device according to claim 1, wherein said analog signal is a direct voltage signal.

10. The device according to claim 1, wherein said analog signal is an alternating voltage signal.

11. The device according to claim 1, wherein said signal conditioner amplifies and scales said analog signal.

12. The device according to claim 1, wherein said signal conditioner amplifies, integrates, and scales said analog signal.

13. The device according to claim 1, further comprising an opto-isolator disposed between said converter and said output signal for electrically isolating the output signal from the first signal.

14. The device according to claim 1, wherein said sensor includes a split core magnetic transformer.

15. The device according to claim 1, wherein said sensor includes a solid core magnetic transformer.

16. A device for measuring current magnitude in a conductor to an electrical device and for generating a signal comprising a series of pulses having a frequency, the frequency of the series of pulses responsive to the magnitude of current measured, the device comprising:

a resistive shunt transducer coupled to said power cable connected to the electrical device, said sensor producing an analog signal in response to the presence of a current within the power cable;

a signal conditioner located proximate to said resistive shunt transducer and being electrically coupled to said resistive shunt transducer so as to receive said analog signal, said signal conditioner producing, in response to receiving said analog signal, a first signal representative of a magnitude of said current; and a converter for receiving and converting said first signal into an output signal comprising a series of pulses having a frequency, the frequency of the series of pulses being responsive to said magnitude of said current, wherein all of said resistive shunt transducer, said signal conditioner, and said converter are located in a single unitary package.

* * * * *

UNITED STATES PATENT AND TRADEMARK OFFICE
CERTIFICATE OF CORRECTION

PATENT NO.    : 6,566,855 B1                                                                Page 1 of 1
DATED         : May 20, 2003
INVENTOR(S)   : Huy D. Nguyen et al.

It is certified that error appears in the above-identified patent and that said Letters Patent is hereby corrected as shown below:

<u>Column 6,</u>
Line 27, replace "said" with -- a --.
Line 28, replace "sensor" with -- resistive shunt transducer --.

Signed and Sealed this

Eleventh Day of November, 2003

JAMES E. ROGAN
*Director of the United States Patent and Trademark Office*